United States Patent
Camacho

(10) Patent No.: US 11,747,024 B2
(45) Date of Patent: Sep. 5, 2023

(54) OVEN AIR CURTAIN

(71) Applicant: Koninklijke Fabriek Inventum B.V., Nieuwegein (NL)

(72) Inventor: Manuel Perez Camacho, Nieuwegein (NL)

(73) Assignee: B/E Aerospace, Inc., Winston Salem, NC (US)

( * ) Notice: Subject to any disclaimer, the term of this patent is extended or adjusted under 35 U.S.C. 154(b) by 128 days.

(21) Appl. No.: 17/137,772

(22) Filed: Dec. 30, 2020

(65) Prior Publication Data

US 2022/0205640 A1    Jun. 30, 2022

(51) Int. Cl.
| | |
|---|---|
| *F24C 15/00* | (2006.01) |
| *F24C 7/08* | (2006.01) |
| *F24C 15/20* | (2006.01) |
| *F24C 15/32* | (2006.01) |
| *H05K 7/20* | (2006.01) |
| *F25D 17/04* | (2006.01) |

(52) U.S. Cl.
CPC ............ *F24C 15/006* (2013.01); *F24C 7/087* (2013.01); *H05K 7/20145* (2013.01); *F24C 15/2028* (2013.01); *F24C 15/32* (2013.01); *F25D 17/045* (2013.01); *H05K 7/20163* (2013.01)

(58) Field of Classification Search
CPC .... F24C 15/006; F24C 15/2028; F24C 15/32; F24C 7/087; H05K 7/20145; H05K 7/20163; F25D 17/045
See application file for complete search history.

(56) References Cited

U.S. PATENT DOCUMENTS

| | | | |
|---|---|---|---|
| 4,865,010 A | 9/1989 | Kett | |
| 8,546,735 B2 | 10/2013 | Choi et al. | |
| 8,649,174 B2 * | 2/2014 | Senatori ................. | G06F 1/203 361/679.48 |
| 10,524,317 B2 | 12/2019 | Kondo et al. | |

(Continued)

FOREIGN PATENT DOCUMENTS

| | | | |
|---|---|---|---|
| DE | 3141617 A1 | * | 5/1983 |
| DE | 3141617 A1 | * | 5/1983 |

(Continued)

OTHER PUBLICATIONS

NASA, Mass Flow Rate Choking, Sep. 17, 2008 (Year: 2008).*
Extended European Search Report for European Patent Application No. EP21217812.3, dated May 30, 2022.

*Primary Examiner* — Dana Ross
*Assistant Examiner* — Bryan M Badalamenti
(74) *Attorney, Agent, or Firm* — Locke Lord LLP; Gabrielle Gelozin; Gabriella D'Angelo

(57) ABSTRACT

An oven comprises an interior electronics cavity defined within electronics cavity walls. The oven includes an air inlet for receiving ambient air from an ambient space outside the electronics cavity into the interior electronics cavity and a first air outlet for returning steam laden air from a cooking space to the ambient space outside the cooking space. The oven also includes a second air outlet positioned to separate flow going into the air inlet from flow from the first air outlet. An air plenum can be defined outside of the cooking space, and the air inlet can be defined in a first portion of an exterior interface of the air plenum. The second air outlet can be defined in a second portion of the exterior interface.

10 Claims, 3 Drawing Sheets

(56) References Cited

U.S. PATENT DOCUMENTS

2007/0138171 A1* 6/2007 Lee ................. H05B 6/642
                                                219/757
2018/0016012 A1* 1/2018 Burd ................ F16B 5/0225
2018/0338666 A1* 11/2018 Seewang ........... A47L 15/4253

FOREIGN PATENT DOCUMENTS

DE          3141617 A1    5/1983
JP          2009293820 A  12/2009

\* cited by examiner

OVEN AIR CURTAIN

BACKGROUND

1. Field

The present disclosure relates to ovens, and more particularly to airflow in ovens.

2. Description of Related Art

Ovens for aircraft galleys can use a fan to draw ambient air into the oven to cool electronics, and to drive steam out of the oven, e.g. through a passage between the oven and a galley wall. However, it is possible for some of the steam to emerge from between the oven and galley wall and become entrained into the inlet for the ambient air. This entrained steam reduces the effectiveness of the fan in removing heat and providing cool dry air, e.g. for cooling oven components as needed. Left unchecked, this can also draw unwanted moisture into portions of the oven where it can compromise efficiency and/or full functionality.

The conventional techniques have been considered satisfactory for their intended purpose. However, there is an ever present need for improved systems and methods for more efficient cooling and humidity control. This disclosure provides a solution for this need.

SUMMARY

An oven comprises an interior electronics cavity defined within electronics cavity walls. The oven includes an air inlet for receiving ambient air from an ambient space outside the electronics cavity into the interior electronics cavity and a first air outlet for returning steam laden air from the cooking space to the ambient space outside the cooking space. The oven also includes a second air outlet positioned to separate flow going into the air inlet from flow from the first air outlet. An air plenum can be defined outside of the cooking space within the electronics cavity, and the air inlet can be defined in a first portion of an exterior interface of the air plenum. The second air outlet can defined in a second portion of the exterior interface.

The oven can further include a flow separator wall extending from the exterior interface inward into the plenum for separating flow out of the second outlet from flow entering the air inlet. The oven can also include a fan in fluid communication with the plenum for driving air from the air inlet into the electronics cavity.

The fan can be a first fan and the oven can include a second fan positioned between the separator wall and an exterior wall of the oven where the second fan can be configured to direct a flow of air from the plenum and out of the second air outlet. The second fan can be in fluid communication with the electronics cavity, where the electronics cavity is a human machine interface case and/or a top cover opening on a wall external of the cooking space. The second fan and separator wall can be configured to generate a flow out of the second outlet that is higher in velocity than flow through the air inlet. The second fan and separator wall can also be configured to generate a flow out of the second outlet that is lower in mass flow rate than flow through the air inlet.

An oven galley assembly can comprise the oven as described above and a galley wall. The galley wall can be separated from a first side of the oven to form an outlet passage from the first outlet of the oven to the ambient space adjacent the second outlet. The second outlet can physically separate the air inlet from the outlet passage.

A method comprises drawing air from an ambient space into an electronics cavity of an oven and exhausting steam laden air from a cooking space into the ambient space. The method can further include, inhibiting entrainment of the steam laden air into the electronics cavity using a flow of air separating flow of air drawn from the ambient space from steam laden air exhausted from the cooking space. Flow velocity of the flow of air separating can be higher than that of air drawing from the ambient space, and flow volume of the flow separating can be lower than that of air drawn in from the ambient space.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
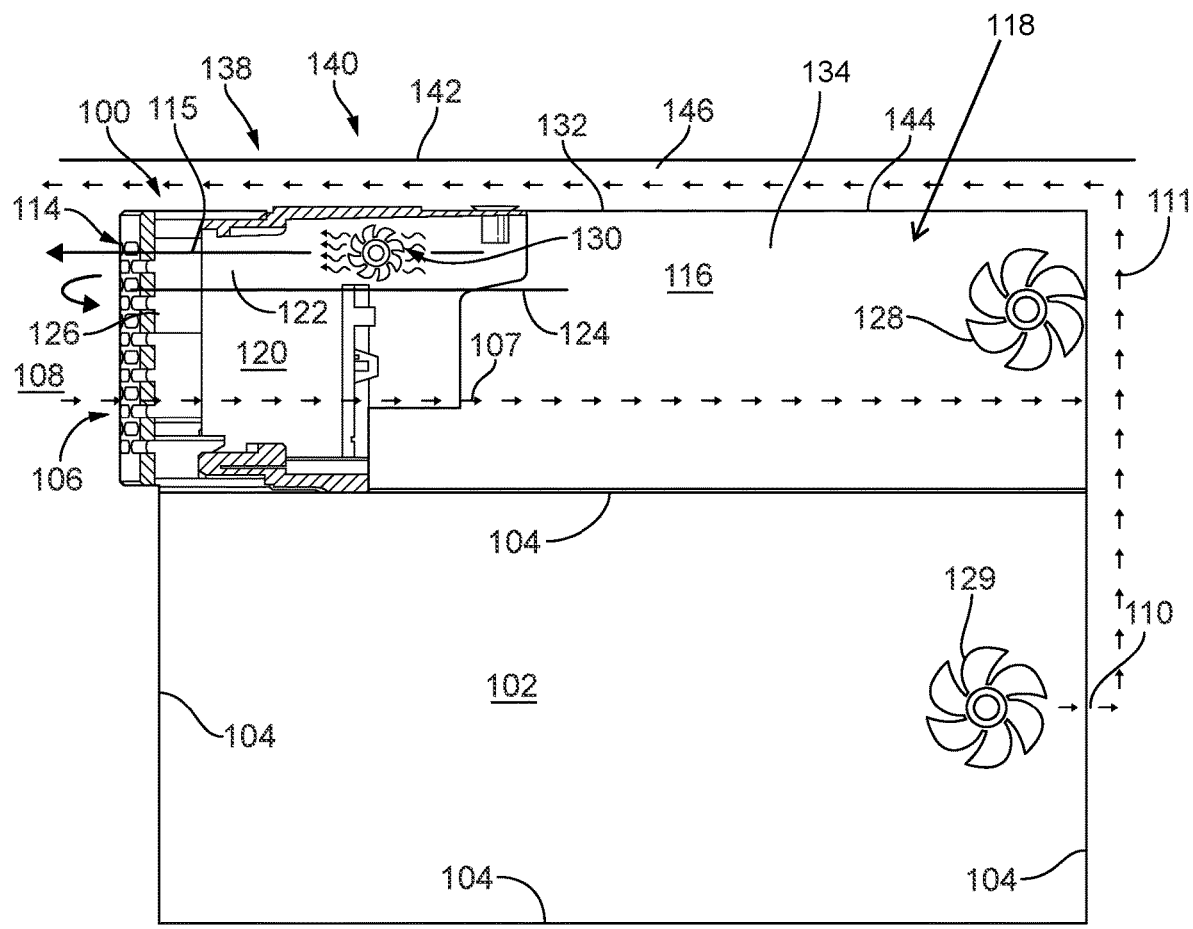
FIG. 1 is a schematic cross sectional view of an embodiment of an oven constructed in accordance with the present disclosure, showing multiple air flow paths within a galley monument.

Reference will now be made to the drawings wherein like reference numerals identify similar structural features or aspects of the subject disclosure. For purposes of explanation and illustration, and not limitation, a partial view of an embodiment of an oven in accordance with the disclosure is shown in FIG. 1 and is designated generally by reference character 100. Other embodiments of systems in accordance with the disclosure, or aspects thereof, are provided in FIG. 2 as will be described. The systems and methods described herein can be used to improve airflow and humidity control within and/or around an oven.

Figure 2:
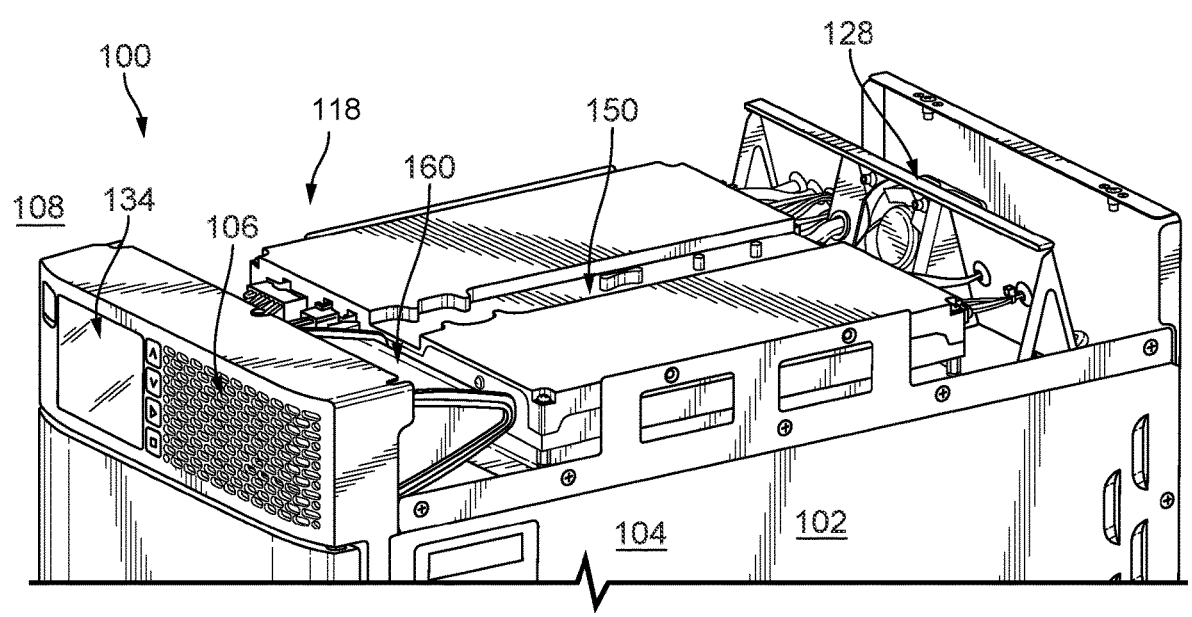
FIG. 2 is a schematic side perspective view of the oven of FIG. 1.
Figure 3:
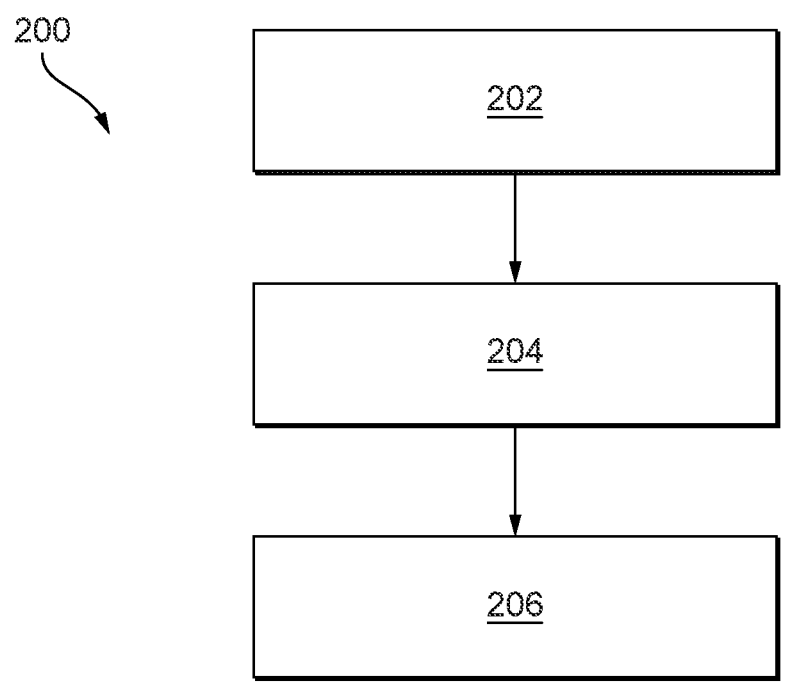
FIG. 3 is a schematic box diagram showing a method in accordance with at least one aspect of this disclosure.

An oven 100 (e.g. a steam oven) can comprise an interior cooking space 102 defined within interior cavity walls 104. The oven 100 can include an air inlet 106 for receiving ambient air from an ambient space 108 outside the cooking space 102 into the interior of an electronics cavity 118 (e.g. arrow 107). An air filter 160 may be included on an interior side of the air inlet 106 (e.g. as shown in FIG. 2). The electronics cavity 118 can be defined by electronics cavity walls 132 and can house electronics 150 for example (for clarity purposes, electronics cavity walls 132 are not drawn in FIG. 2).

A first air outlet 110 can be included for exhausting steam laden air from the cooking space 102 to the ambient space 108 outside the cooking space 102, for example as shown by arrow 111. The oven 100 can also include a second air outlet 114 positioned to separate flow going into the air inlet 106 from flow effusing from the first air outlet 110. For example, arrow 111 shows a flow of air from the first air outlet 110, arrow 115 shows a flow of air from the second air outlet, and arrow 107 shows a flow of air from the ambient space 108 into air inlet 106. Fan 129 may be included to distribute the heat within the interior cooking space 102, creating an homogeneous temperature inside the inner cooking space 102 when cooking. When the temperature of the interior cooking space increases, and/or water is injected for steam cooking, pressure builds within the interior cooking space 102, and steam may be released to ambient space outside of the oven 100, e.g. by first air outlet 110.

The oven 100 can include an air plenum 116 separated from, and outside the cooking space 102. In the example shown in FIG. 1, the air plenum 116 can be defined by a compartment, such as electronics cavity 118. In embodiments, the electronics cavity 118 can be an interior of a human-machine interface (HMI) case 134 and/or a top cover opening on a wall external of the cooking space 102. The air inlet 106 can be defined in a first portion 120 of the air plenum 116 and the second air outlet 114 can be defined in a second portion 122 of the air plenum 116, for example above the air inlet 106 as shown.

The oven 100 can further include a flow separator wall 124 extending from an exterior interface 126 of the oven 100, the flow separator wall 124 extending inward and into the air plenum 116 for separating flow out of the second air outlet 114 from flow entering the air inlet 106. As shown in FIG. 1, the oven 100 can also include at least one fan 128 in fluid communication with the air plenum 116 for driving air from the air inlet 106 into the electronics cavity 118.

In embodiments, the oven 100 can include another fan 130 positioned between the separator wall 124 and an exterior wall 132 of the oven 100. The fan 130 can be configured to direct a flow of air from the air plenum 116 out of the second air outlet 114, e.g. as shown by arrow 115. The fan 130 and separator wall 124 can thus be configured to generate a flow (e.g. arrow 115) out of the second air outlet 114 that is higher in velocity than flow through the air inlet 106.

Additionally, or alternatively, the fan 130 and separator wall 124 can also be configured to generate a flow out of the second air outlet 114 that is lower in mass flow rate than flow through the air inlet 106. Conventionally, because the steam laden air effusing from the first air outlet 110 has a low speed, the air inlet 106 speed is a higher driving force than the natural convection (i.e. cold dry air is heavier than hot humid air), thus leading to steam laden air being sucked in through the air inlet 106. Therefore, a higher velocity air flow from the second air outlet 114 as described can create a protective air curtain, preventing the steam laden air from returning through the air inlet 106.

The oven 100 described above can be included in a galley monument 138, as partially in shown in FIG. 1. The oven 100 and galley monument 138 together can be considered a galley assembly 140. The galley monument 138 can include a plurality of walls, such as galley wall 142 as shown. The galley wall 142 can be separated from a first side 144 of the oven 100 to form an outlet passage 146 from the first air outlet 110 of the oven to the ambient space 108 adjacent the second air outlet 114. As shown, the second air outlet 114 can physically separate the air inlet 106 from the outlet passage 146.

A method 200 can comprise, at box 202, drawing air from an ambient space 108 into an electronics cavity 118 of the oven 100 (e.g. arrow 107). At box 204, the method 200 can include exhausting steam laden air from the cooking space 102 into the ambient space 108 (e.g. arrow 111). Shown at box 206, the method 200 can further include, inhibiting entrainment of the steam laden air into the electronics cavity 118 using a flow of air separating flow of air drawn from the ambient space 108 from steam laden air exhausted from the interior cooking space 102 and conducted through outlet passage 146. As described above, flow velocity of the flow of air separating the air inlet and the first air outlet (e.g. arrow 115) can be higher than that of air drawing from the ambient space (e.g. arrow 107), while flow volume of the flow separating the air inlet and the first air outlet (e.g. arrow 115 can be lower than that of air drawn in from the ambient space (e.g. arrow 107).

The methods and systems of the present disclosure, as described above and shown in the drawings, provide for a decrease in the temperature of the air meant to cool oven electronics and inner components, leading to cooler electronics and improved reliability. Generally, because steam sucked in by the fan will eventually condensate on the coolest inner surfaces (such as connectors, wiring harness, and the like), the humidity can lead to terminal corrosion and other electrical issues. The systems and method described herein therefore provide for reduced humidity within the electronics cavity, preventing condensation buildup on electronics. While the apparatus and methods of the subject disclosure have been shown and described, those skilled in the art will readily appreciate that changes and/or modifications may be made thereto without departing from the scope of the subject disclosure.

What is claimed is:

1. An oven galley assembly comprising:
an oven comprising
an interior electronics cavity defined within electronics cavity walls;
an air inlet for receiving ambient air from an ambient space outside the interior electronics cavity into the interior electronics cavity;
an exhaust outlet for exhausting steam laden air from an interior cooking space;
a galley wall separated from a first side of the oven to form an outlet passage between the exhaust outlet and an outlet defined between the interior electronics cavity and the galley wall for returning steam laden air to the ambient space, wherein an air curtain outlet is positioned to separate flow going into the air inlet from flow from the outlet defined between the interior electronics cavity and the galley wall, wherein the air curtain outlet physically separates the air inlet from the outlet defined between the interior electronics cavity and the galley wall.

2. The oven galley assembly as recited in claim 1, wherein an air plenum is defined outside of the interior cooking space, wherein the air inlet is defined in a first portion of an exterior interface of the air plenum, and wherein the air curtain outlet is defined in a second portion of the exterior interface.

3. The oven galley assembly as recited in claim 2, further comprising a flow separator wall extending from the exterior interface inward into the air plenum for separating flow out of the air curtain outlet from flow entering the air inlet.

4. The oven galley assembly as recited in claim 3, further comprising:
a fan in fluid communication with the air plenum for driving air from the air inlet into the interior electronics cavity.

5. The oven galley assembly as recited in claim 4, wherein the fan is a first fan and further comprising a second fan positioned between the flow separator wall and an exterior wall of the oven, the second fan being configured to direct a flow of air from the air plenum and out of the air curtain outlet.

6. The oven galley assembly as recited in claim 5, wherein the interior electronics cavity is a human machine interface case on a wall external of the interior cooking space.

7. A method comprising:
drawing air from an ambient space into an electronics cavity of an oven, wherein the interior electronics cavity is defined within electronics cavity walls; wherein ambient air is received from the ambient space outside the interior electronics cavity into the interior electronics cavity;
exhausting steam laden air from an interior cooking space into the ambient space via an outlet passage formed between a galley wall and a first side of the oven; and
inhibiting entrainment of the steam laden air into the electronics cavity using a flow of air separating flow of air drawn from the ambient space from the steam laden air exhausted from the cooking space, wherein flow velocity of the flow of air separating flow of air drawn from the ambient space from the steam laden air exhausted from the cooking space is higher than that of air drawn in from the ambient space, and wherein flow volume of the flow separating flow of air drawn from the ambient space from the steam laden air exhausted from the cooking space is lower than that of air drawn in from the ambient space.

8. The oven galley assembly as recited in claim 1, wherein an air plenum is defined outside of the interior cooking space within the electronics cavity.

9. The oven galley assembly as recited in claim 5, wherein the second fan and the flow separator wall are configured to generate a flow out of the air curtain outlet that is higher in velocity than flow through the air inlet.

10. The oven galley assembly as recited in claim 5, wherein the second fan and the flow separator wall are configured to generate a flow out of the air curtain outlet that is lower in mass flow rate than flow through the air inlet.

\* \* \* \* \*